United States Patent [19]
Fulkerson

[11] Patent Number: 5,982,198
[45] Date of Patent: Nov. 9, 1999

[54] FREE INVERTER CIRCUIT

[75] Inventor: David E. Fulkerson, Minnetonka, Minn.

[73] Assignee: Honeywell Inc., Minneapolis, Minn.

[21] Appl. No.: 08/820,928

[22] Filed: Mar. 19, 1997

[51] Int. Cl.$^6$ .................... H03K 19/0944; H03K 19/017
[52] U.S. Cl. ............................... 326/119; 326/17; 326/83; 326/113
[58] Field of Search .................................. 326/112, 119, 326/113, 116, 17, 83

[56] References Cited

U.S. PATENT DOCUMENTS

| | | |
|---|---|---|
| 3,596,108 | 7/1971 | Heeren . |
| 3,986,042 | 10/1976 | Padgett et al. . |
| 4,566,064 | 1/1986 | Whitaker . |
| 4,602,170 | 7/1986 | Bertin .................................... 326/112 |
| 4,710,649 | 12/1987 | Lewis ...................................... 326/113 |
| 4,714,840 | 12/1987 | Proebsting ............................. 326/83 |
| 4,870,305 | 9/1989 | Rocchi . |
| 5,216,294 | 6/1993 | Ryu ........................................... 326/57 |
| 5,448,182 | 9/1995 | Countryman et al. ................... 326/83 |

FOREIGN PATENT DOCUMENTS 2 245 098  12/1991  United Kingdom .

*Primary Examiner*—Jon Santamauro
*Attorney, Agent, or Firm*—Gregory A. Bruns

[57] ABSTRACT

A logic circuit includes a potential coupled to a node and a first transistor coupled between a first input and the output with its gate coupled to the node. At least a second transistor is coupled between the node and ground with its gate coupled to a second input. At least a third transistor is coupled between the output terminal and ground with its gate connected to the second input.

12 Claims, 6 Drawing Sheets

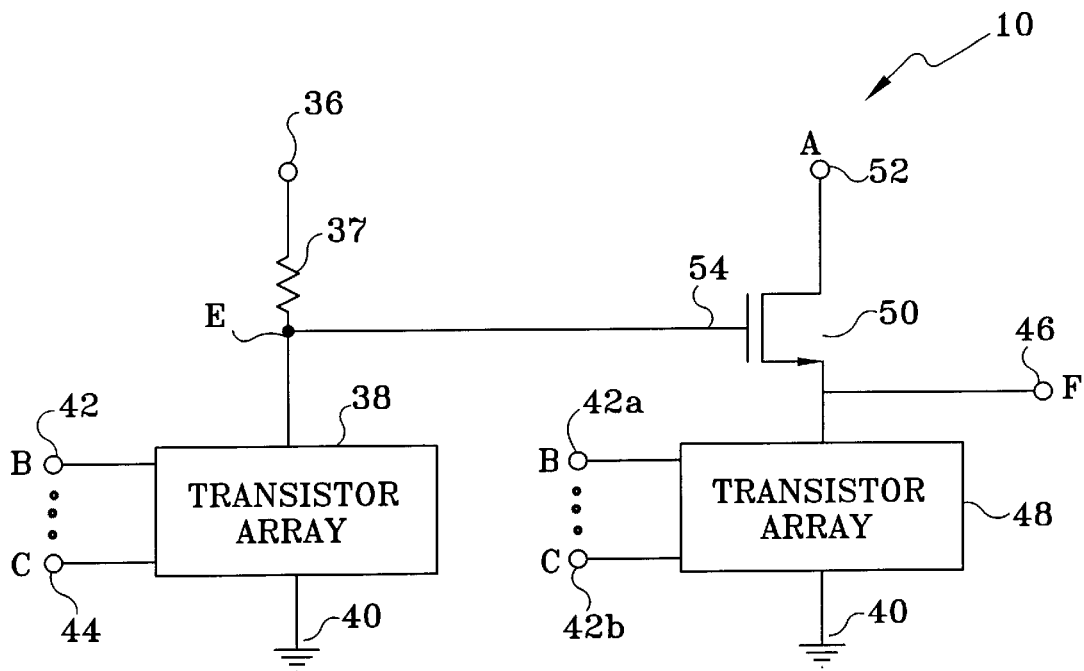
Fig.1
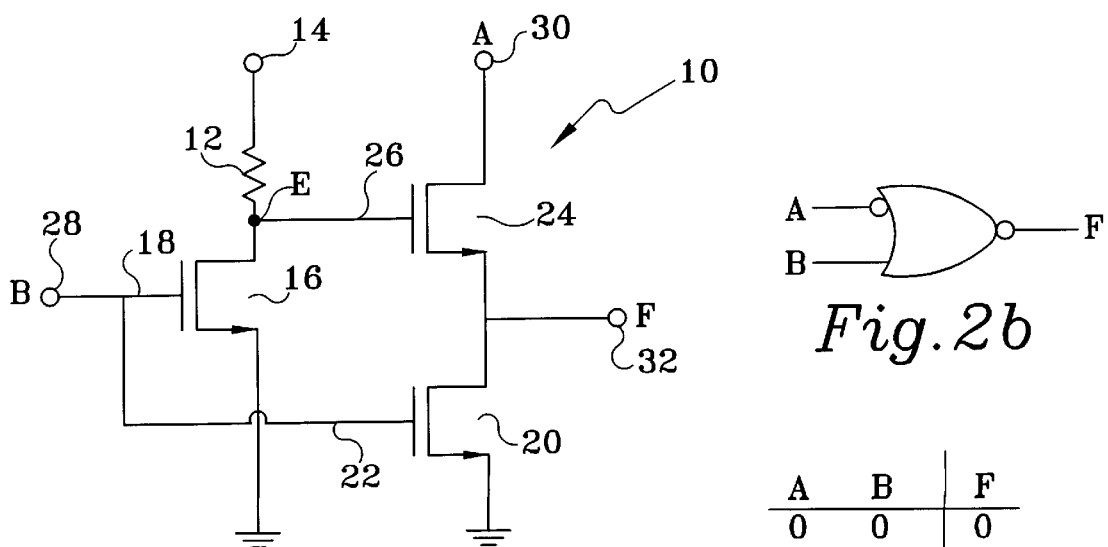
Fig.2a
Fig.2b
| A | B | F |
|---|---|---|
| 0 | 0 | 0 |
| 0 | 1 | 0 |
| 1 | 0 | 1 |
| 1 | 1 | 0 |
Fig.2c

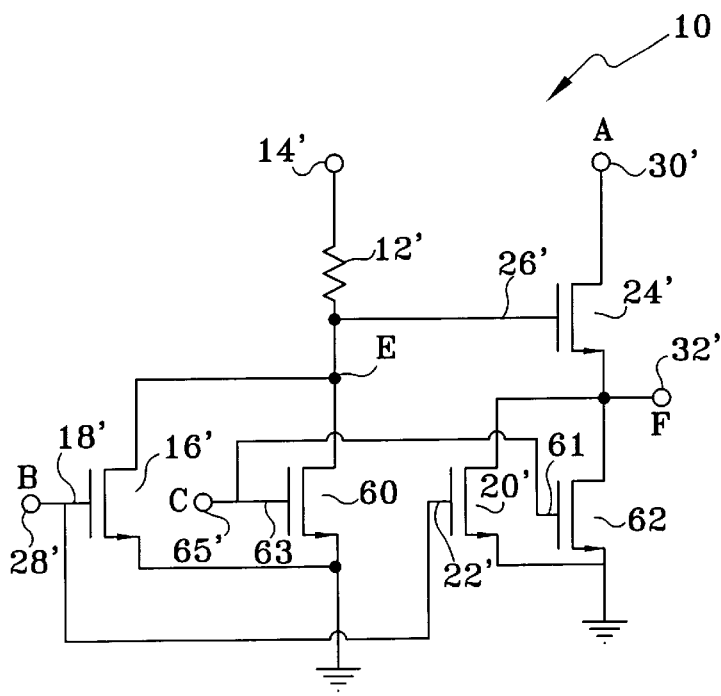
Fig. 3a
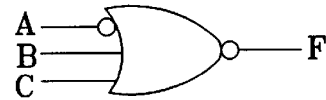
Fig. 3b
| A | B | C | F |
|---|---|---|---|
| 0 | 0 | 0 | 0 |
| 0 | 0 | 1 | 0 |
| 0 | 1 | 0 | 0 |
| 0 | 1 | 1 | 0 |
| 1 | 0 | 0 | 1 |
| 1 | 0 | 1 | 0 |
| 1 | 1 | 0 | 0 |
| 1 | 1 | 1 | 0 |
Fig. 3c
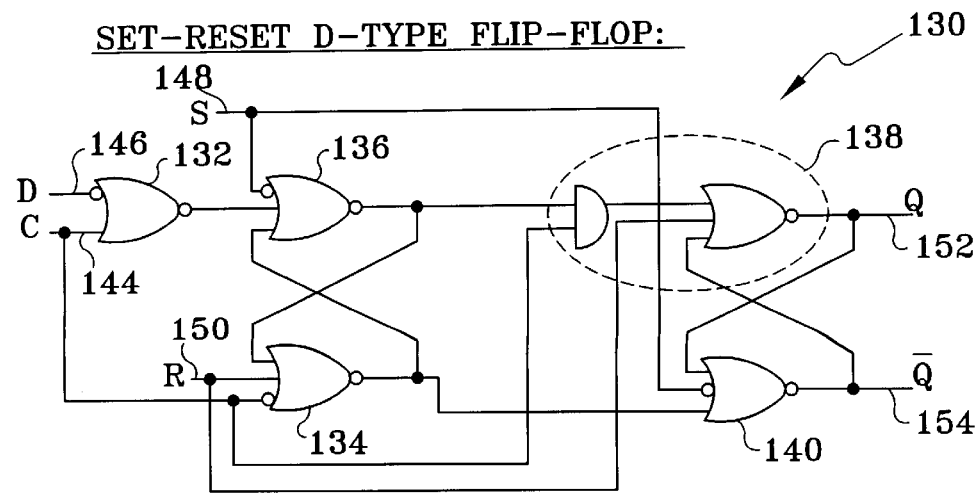
Fig. 7

XNOR:

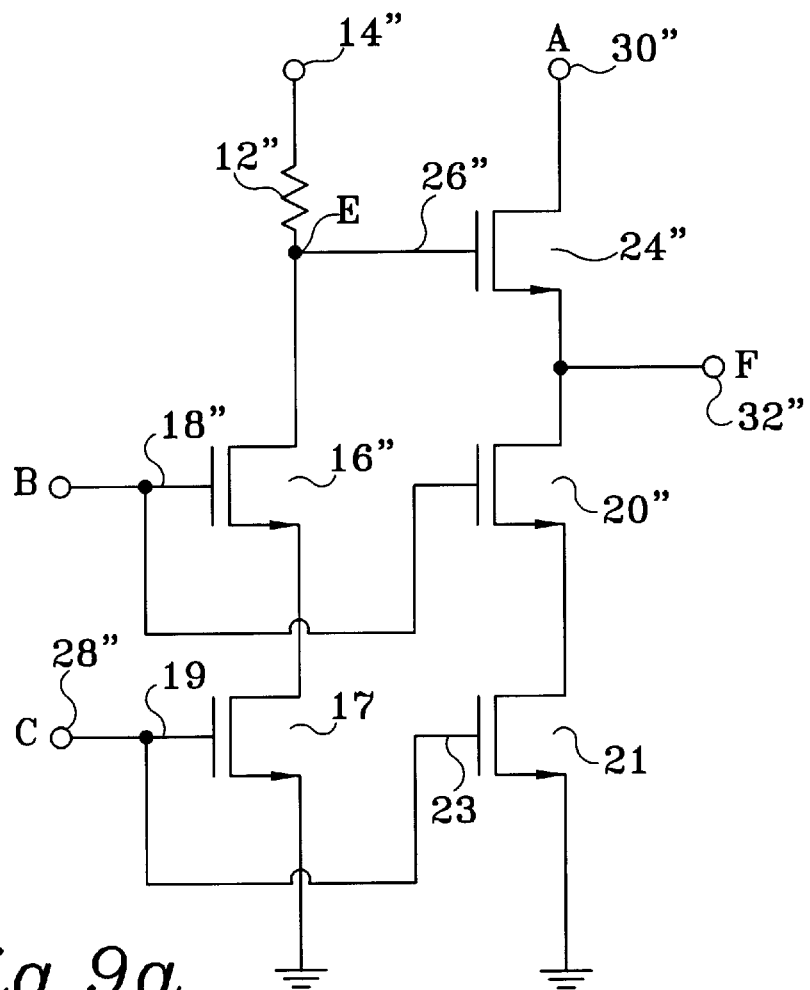
*Fig. 9a*
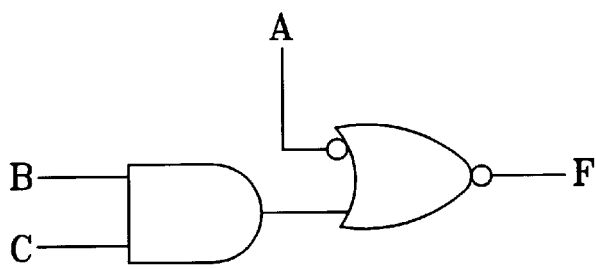
*Fig. 9b*
| A | B | C | F |
|---|---|---|---|
| 0 | 0 | 0 | 0 |
| 0 | 0 | 1 | 0 |
| 0 | 1 | 0 | 0 |
| 0 | 1 | 1 | 0 |
| 1 | 0 | 0 | 1 |
| 1 | 0 | 1 | 1 |
| 1 | 1 | 0 | 1 |
| 1 | 1 | 1 | 0 |
*Fig. 9c*

FREE INVERTER CIRCUIT

BACKGROUND OF THE INVENTION

The present invention relates generally to the field of solid state electronics and specifically to integrated circuitry for digital logic applications.

There is a universal need for digital logic circuits that operate at higher speed and consume less power.

In many applications there is a need to provide an inverter function. In the past this has been accomplished with a separate inverter which requires chip area and power. Thus a need exists for a logic circuit that is functionally equivalent to inverting one of the inputs without requiring the investment in the extra logic gate to perform the function.

SUMMARY OF THE INVENTION

The present invention solves these and other needs by providing a "free inverter" circuit. It is called a "free inverter" circuit because it is the equivalent of inverting one of the inputs, and yet it requires less space and power than the past approach of providing a separate inverter.

The present invention provides a logic circuit that includes at least two input terminals, an output terminal and a potential coupled to a node. A first transistor is coupled between a first input terminal and the output terminal, with its gate connected to the node. At least a second transistor is coupled between the node and ground with its gate connected to the second input terminal. At least a third transistor is coupled between the output terminal and ground with its gate connected to the second input terminal. With the first input high, the circuit functions as an inverter relative to the second input. With the second input low, the signal at the output has the same polarity as the first input and has a delay substantially less than an inverting gate delay.

BRIEF DESCRIPTION OF THE DRAWINGS

FIG. 1 shows the block diagram of a multiple input circuit, according to a preferred embodiment, to illustrate the basic principle of the present invention.

FIGS. 2a–2c show the actual implementation of a two-input logic gate, the logic symbol and the truth table according to the preferred embodiment of FIG. 1.

FIGS. 3a–3c show the actual implementation of a three-input logic gate, the logic symbol and the truth table according to the preferred embodiment of FIG. 1.

FIG. 4b is a simulation of an input-output voltage characteristic of the logic circuit of the present invention when used as shown in FIG. 4a.

FIG. 5b is a simulation of an input-output voltage characteristic of the logic circuit of the present invention when used as shown in FIG. 5a.

FIG. 6b is a logic diagram of a latch circuit using the present invention to solve the problems of FIG. 6a.

FIG. 7 is a logic diagram of a flip-flop circuit using the present invention.

FIGS. 9a–c show an actual implementation of a three-input logic circuit, the logic diagram and the truth table according to the preferred embodiment of FIG. 1.

DETAILED DESCRIPTION OF THE PREFERRED EMBODIMENT

Figure 4A:
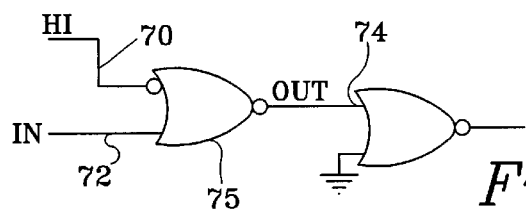
FIG. 4a shows a logic diagram for the use of the implementation of FIG. 2a in an inverting mode.

A logic circuit in accordance with the principles of the present invention is shown in the drawings and generally designated 10.

FIG. 1 illustrates a preferred embodiment of the present invention. In FIG. 1 a positive voltage supply 36 is coupled through a current source means or an impedance means 37 to a node E. A transistor array 38 is connected between node E and a second voltage 40 which is typically ground.

Transistor array 38 includes an arrangement of transistors dependent on the logic function to be performed by circuit 10, as will be explained. Transistor array 38 may include any number of input terminals, but as shown here includes input terminals 42 and 44.

The form of circuit 10 of FIG. 1 includes an output terminal 46. A second transistor array 48 is connected between output terminal 46 and ground. Transistor array 48 includes an arrangement of transistors dependent on the logic functions and includes a number of input terminals corresponding to the input terminals of transistor array 38 which are designated here as 42a and 42b.

Transistor 50 is coupled between input terminal 52 and output terminal 46, and has a gate 54 connected to node E.

The circuit of FIG. 1 may be constructed to perform various logic functions having the characteristic that output F will be low when input A is low, regardless of the signal at input B, input C, or other inputs.

As a specific example of the preferred embodiment of FIG. 1, FIG. 2a shows a two input logic function where all transistors are enhancement mode n-channel field-effect transistors. A logic symbol is shown in FIG. 2b and a truth table in FIG. 2c. The logic symbol will be used herein to identify the use of the circuit of FIG. 2a. The circuit of FIG. 2a will perform the logic function $(\overline{A}+B)$. In FIG. 2a, an impedance means or current source means, such as resistor 12, is connected between positive voltage supply 14 and node E. Transistor 16 is connected between node E and ground and gate 18 of transistor 16 is connected to an input terminal 28. Circuit 10 of FIG. 1 includes an output terminal 32. Transistor 20 is connected between output terminal 32 and ground, and has a gate 22 connected to input terminal 28. Transistor 24 is coupled between input terminal 30 and output terminal 32, and has a gate 26 connected to node E.

In operation, with both input A and input B low, transistors 16 and 20 will be off, node E will be high turning transistor 24 on, but with A low, output F will be low. With input A low and input B high, both transistors 18 and 20 will be on. Node E will be pulled low by transistor 16 causing transistor 24 to be off. Output F will be pulled low by transistor 20 and will remain low regardless of the signal at input A. With input A high and input B low, transistors 16 and 20 will be off, causing node E to be high. With both transistor 16 and transistor 20 off, they have no effect on circuit 10. Therefore, positive voltage 14 is connected through resistor 12 to gate 26 of transistor 24, causing transistor 24 to be on. Under these conditions and with a high signal at A, the high signal at A will be coupled to output F. With input A high and input B high, transistors 16 and 20 will be on, node E will be pulled low by transistor 16, so that transistor 24 will be off, the high signal at A will not be coupled to output F, and output F will be low.

As another specific example of the preferred embodiment of FIG. 1, FIG. 3a shows a three input logic circuit that will perform the logic function $(\overline{A+B}+C)$. A logic symbol is shown in FIG. 3b and a truth table in FIG. 3c. The logic symbol will be used herein to identify the use of the circuit of FIG. 3a. FIG. 3a adds an additional input "C" to the circuit of FIG. 2a, and a "'" designation is used in FIG. 3a for components similar to components of FIG. 2a. FIG. 3a includes transistor 60 connected in parallel with transistor 16' and transistor 62 connected in parallel with transistor 20'. Gate 61 of transistor 62 and gate 63 of transistor 60 are connected to input terminal 65. The operation of the circuit of FIG. 3a differs from that of the circuit of FIG. 2a in that either input B or input C can function as only input B could function in FIG. 2a.

As another specific example of the preferred embodiment of FIG. 1, FIG. 9a shows a three input logic circuit that will perform the logic function $\overline{B \cdot C + A}$. A logic diagram is shown in FIG. 9b and a truth table in FIG. 9c. FIG. 9a adds an additional input "C" to the circuit of FIG. 2a and a "''" designation is used in FIG. 9a for components similar to components of FIG. 2a. FIG. 9a includes transistor 17 connected in series with transistor 16" and transistor 21 connected in series with transistor 20". Gate 19 of transistor 17 and gate 23 of transistor 21 are connected to input terminal 28". The operation of the circuit of FIG. 9 differs from that of the circuit of FIG. 2a in that both input B and input C must be high to turn on transistor 17 and transistor 21 in order to pull node E low.

Now that the basic operation of circuit 10 has been described, certain advantages may be set forth and appreciated.

Figure 8A:
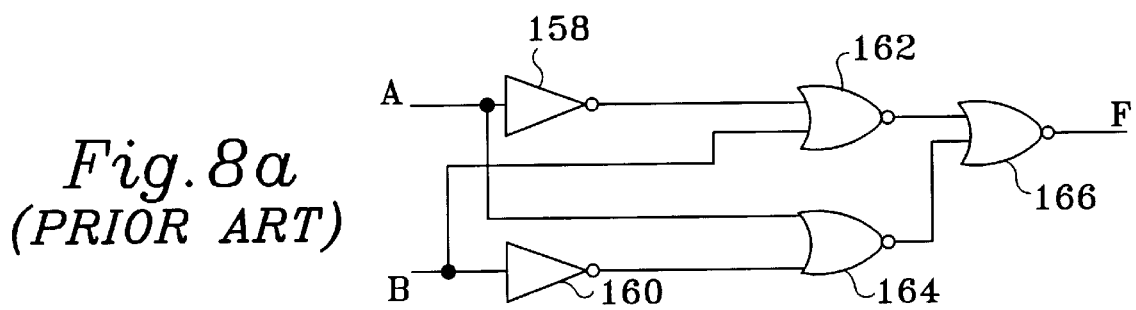
FIG. 8a is a logic diagram of an exclusive NOR gate as found in the prior art.

For example, in the past, to construct an exclusive NOR gate out of simple NOR gates and inverters required the arrangement of FIG. 8a. This exclusive NOR used inverters 158 and 160, and NOR gates 162, 164 and 166.

Figure 8B:
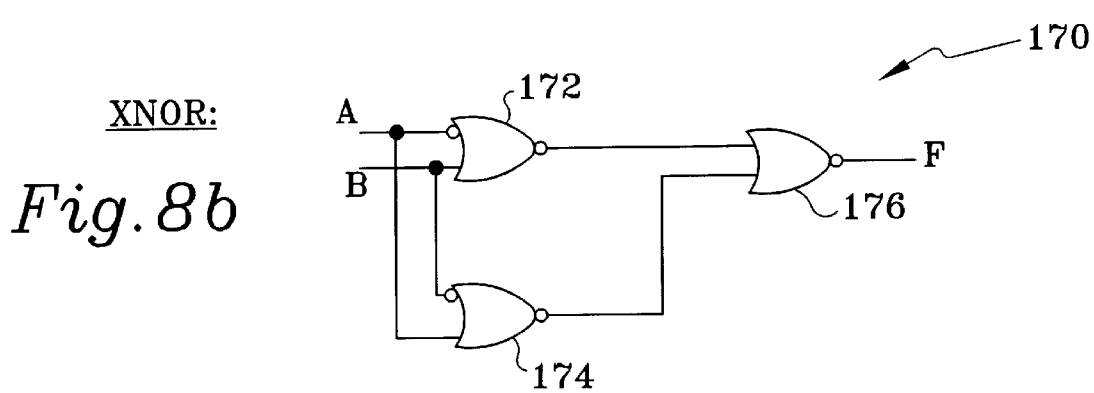
FIG. 8b is a logic diagram of an exclusive NOR gate using the present invention.

Circuit 10 may be used to construct an exclusive NOR function $F=(\overline{A}+B) \cdot (A+\overline{B})$, the logic diagram of which is shown in FIG. 8b and designated 170. Circuit 170 includes logic circuit 10 in gate 172 and gate 174 and, in addition, includes NOR gate 176.

Circuit 10 may be used in an inverting mode or in a non-inverting mode. FIG. 4a shows circuit 10 in an inverting mode with input 70 which corresponds to input A of FIG. 2a being high, input 72 which represents a varying logic level signal, and logic gate 75, which includes circuit 10 and provides an output 74. Referring to FIG. 2a, it will be understood that with input A high and input B high, transistors 16 and 20 will be turned on, causing transistor 20 to pull output F low. Node E will also be pulled low by transistor 16, causing transistor 24 to be off. With input A still high, as input B goes low, transistors 16 and 20 will be turned off, causing node E to go high, turning on transistor 24 and pulling output F high.

Figure 4B:
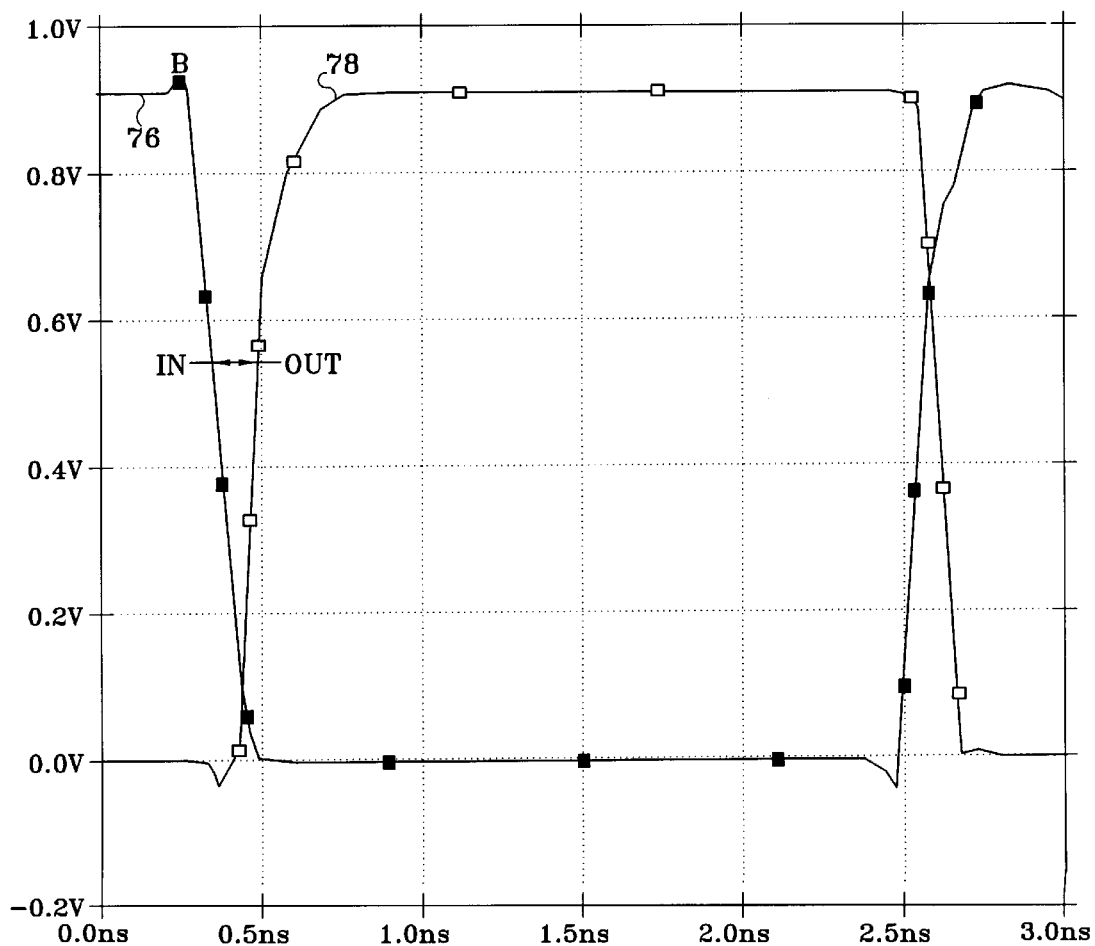

A simulation of the circuit of FIG. 4a in an inverting mode is shown in FIG. 4b where 76 represents input 72 and 78 represents output 74.

Figure 5A:
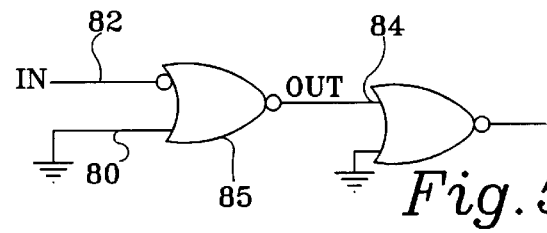
FIG. 5a shows a logic diagram for the use of the implementation of FIG. 2a in a non-inverting mode.

Circuit 10 may also be used in a non-inverting mode as shown in FIG. 5a. Where input 80 corresponding to input B of FIG. 2a is low, input 82 represents a varying logic level signal, and logic gate 85, which includes circuit 10, provides an output 84. Referring again to FIG. 2a, it will be seen that with input B low, transistors 16 and 20 will be turned off, i.e., they are effectively out of the circuit, causing node E to be high and therefore transistor 24 to be turned on. With transistor 24 turned on, then output F will simply follow input A.

Figure 5B:
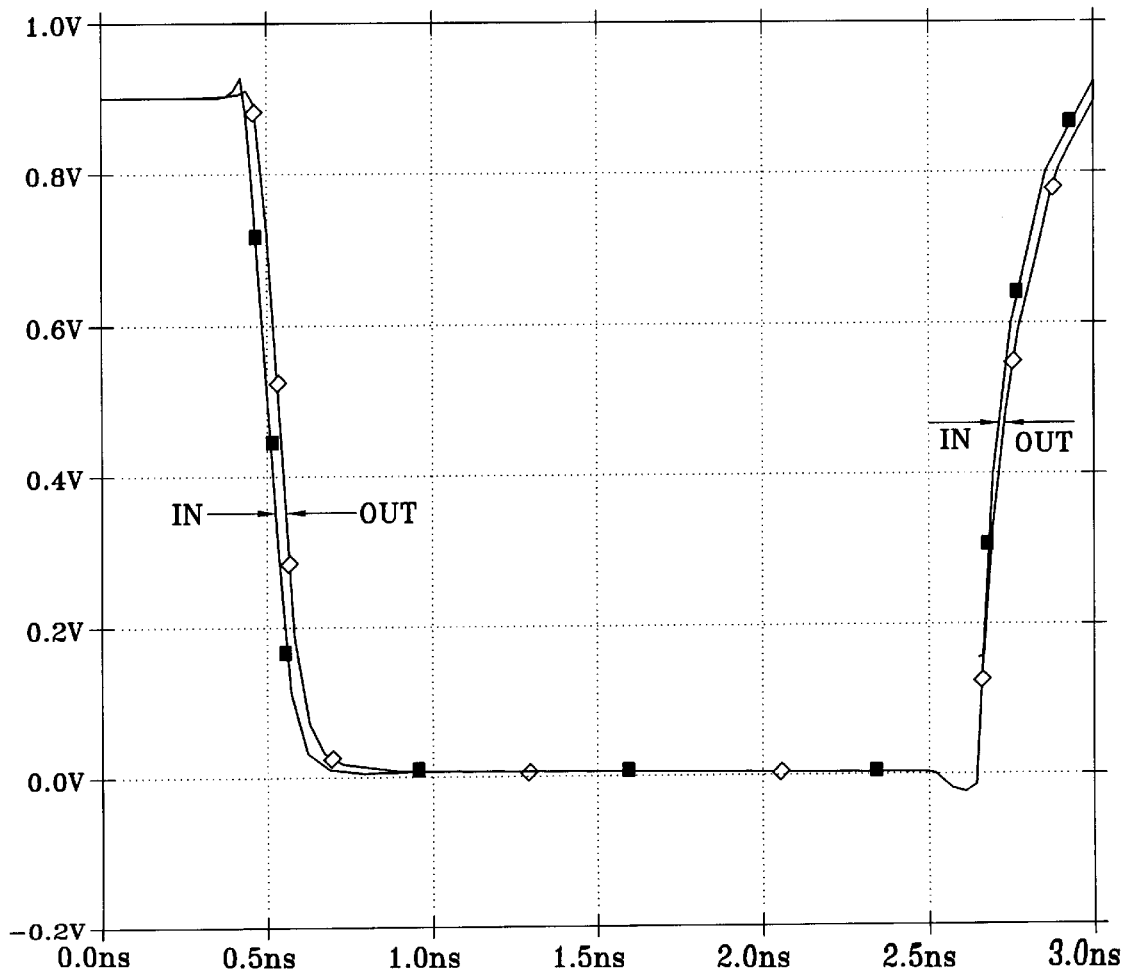

A simulation of the circuit of FIG. 5a in a non-inverting mode is shown in FIG. 5b where 86 represents input 82 and 88 represents output 84. Note that the delay of the non-inverting mode is substantially less than the gate delay of FIG. 4b and in this simulation is of the order of 0.02 nanoseconds.

Figure 6A:
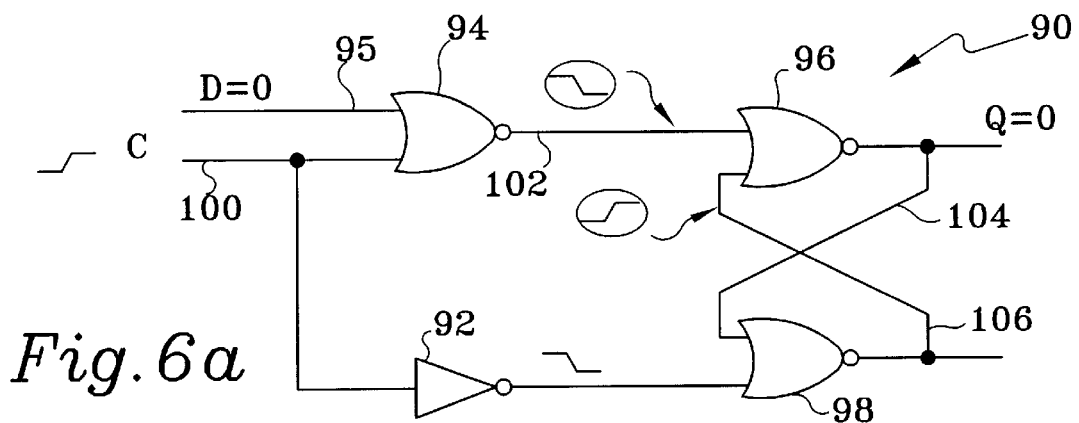
FIG. 6a is a logic diagram of a latch circuit illustrating certain timing problems.

Circuit 10 allows more complex logic circuits to be constructed more efficiently than in the past. One example is a simple latch 90 as illustrated in FIG. 6a which includes inverter 92 and nor gates 94, 96 and 98. In the past there would be a critical race problem with the circuit that can be described as follows. The desired operation is to "latch in" a value of "0" for D and have latch 90 hold this value when the clock signal at 100 changes from 0 to 1. When clock signal 100 goes high, output 102 of NOR gate 94 goes low. In order for output 104 of NOR gate 96 to remain at "0" output, a high signal at 106 must reach NOR gate 96 before a low signal at 102 reaches NOR gate 96. With the circuit of FIG. 6a, this will not occur because the clock signal at 100 must pass through inverter 92 and NOR gate 98 before reaching NOR gate 96. That is, it will have a gate delay at inverter 92 and a gate delay at NOR gate 98, whereas the signal at 95 will only have a gate delay at NOR gate 94.

Figure 6B:
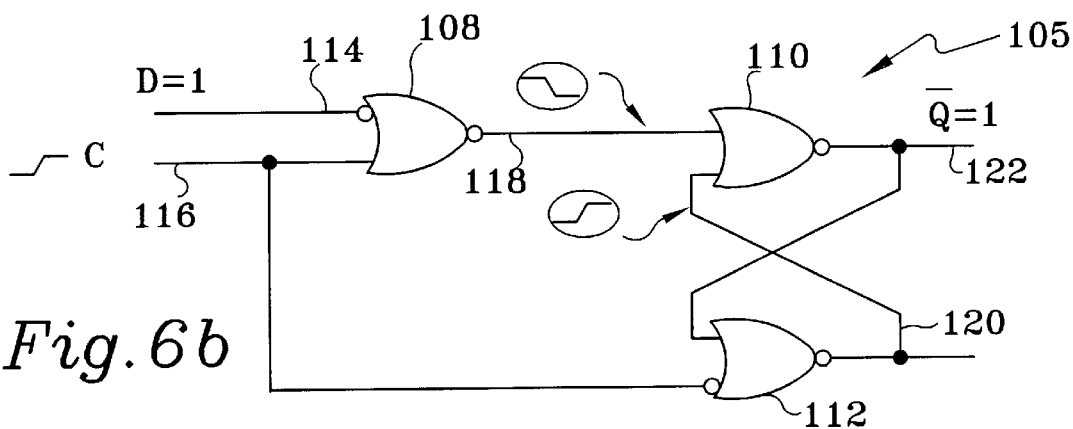

FIG. 6b is an example of a functionally similar latch 105 which is implemented with the logic circuit of the present invention. FIG. 6b includes NOR gate 110, logic circuit 10 in gate 108, and logic circuit 10 in gate 112. Gate 108 has data input 114, clock input 116 and output 118 which is connected to one input of NOR gate 110. Gate 112 has clock signal 116 as one input. NOR gate 110 has output 122 and gate 112 has output 120 which are connected to an input of gate 112, and an input of NOR gate 110 respectively. In FIG. 6b input 114 has been inverted to make the circuit faster. In operation with $\overline{Q}=0$, the desired operation is to have $\overline{Q}$ remain at 0 when clock signal 116 goes from low to high, i.e., signal 120 must arrive at NOR gate 110 before signal 118 arrives. Note that logic gate 112 is connected as in FIG. 5a, i.e., in a non-inverting mode. With clock signal 116 connected to the "A" input of free inverter circuit 112, then clock signal 116 will clearly arrive at NOR gate 112 before signal 118 arrives because the delay in the non-inverting mode is shorter than the delay in the inverting mode.

A set-reset D-type flip-flop 130 may be constructed using logic circuit 10 as shown in the logic diagram of FIG. 7. Flip-flop 130 uses logic circuit 10 in gate 132, gate 134, gate 136 and gate 140. Flip-flop 130 also includes NOR gate 136 and AND-NOR gate 138. Inputs include clock input 144, data input 146, set 148 and reset 150. Outputs are Q at 152 and $\overline{Q}$ at 154. Logic circuit 10 is used in flip-flop 130 to provide a fundamentally simple circuit which will operate at high speed.

Thus Applicant has disclosed a logic circuit that offers significant advantages and that can be implemented in Si or III/V materials such as GaAs.

The scope of this invention is to be limited by the appended claims and not by the foregoing description.

I claim:

1. A field effect transistor (FET) logic circuit comprising:
   a plurality of input terminals;

an output terminal;

a first potential coupled through an impedance means to a node;

a first FET having a first terminal connected to a first one of said plurality of input terminals, a second terminal connected to said output terminal, and a gate terminal connected to said node;

at least one second FET, coupled between said node and ground and having a gate terminal connected to a second one of said plurality of input terminals;

at least one third FET, coupled between said output terminal and ground and having a gate terminal connected to said second one of said plurality of input terminals;

wherein a signal at said output terminal represents the following logic function $(\overline{A}+\overline{B})$, with A being a signal applied to said first one of said plurality of input terminals and B being a signal applied to said second one of said plurality of input terminals; and wherein said B signal is low and said signal at said output terminal has the same polarity as said A signal and is delayed from said A signal by a first period of time that is substantially less than an inverting gate delay.

2. Logic circuit of claim 1 wherein said logic circuit is implemented in a III/V material.

3. Logic circuit of claim 1 further comprising:

an additional second FET coupled between said node and ground and having a gate connected to a third one of said plurality of input terminals; and an additional third FET coupled between said output terminal and ground and having a gate connected to said third one of said plurality of input terminals.

4. Logic circuit of claim 3 wherein said second FETs are connected in parallel and said third FETs are connected in parallel.

5. Logic circuit of claim 3 wherein said second FETs are connected in series and said third FETs are connected in series.

6. A FET logic circuit comprising:

at least two input terminals;

an output terminal;

a positive voltage supply;

an impedance means coupled to said positive voltage supply;

a first transistor coupled between a first one of said two input terminals and said output terminal;

a second transistor coupled between said impedance means and ground, said second transistor having a gate coupled to a second one of said two input terminals;

a node located between said impedance means and said second transistor;

a third transistor coupled between said output terminal and ground, said third transistor having a gate coupled to said second one of said two input terminals;

wherein a signal at said output terminal is low when a first set of signal values are present at said two input terminals and a signal at said output terminal is high when a second set of signal values different from said first set of signal values are present at said two input terminals; and wherein said signal at said output terminal represents the following logic function $(\overline{A}+\overline{B})$, with A being a signal applied to said first one of said two input terminals and B being a signal applied to said second one of said two input terminals.

7. Logic circuit of claim 6 wherein said A signal is high and said logic circuit functions as an inverter relative to said B signal.

8. Logic circuit of claim 6 wherein said B signal is low and said signal at said output terminal has the same polarity as said A signal and is delayed from said A signal by a period of time that is substantially less than an inverter gate delay.

9. Logic circuit of claim 6 wherein said logic circuit is implemented in a III/V material.

10. Logic circuit of claim 6 further comprising:

an additional second FET coupled between said node and ground;

an additional third FET coupled between said output terminal and ground;

said additional second FET having a gate coupled to an additional input terminal; and said additional third FET having a gate coupled to said additional input terminal.

11. Logic circuit of claim 10 wherein said signal at said output terminal represents the following logic function $(\overline{A+B+C})$, with A being a signal applied to said first one of said at least two said input terminals, B being a signal applied to said second one of said at least two input terminals and C being a signal applied to said additional input terminal.

12. Logic circuit of claim 10 wherein said signal at said output terminal represents the following logic function $(\overline{B \cdot C + A})$, with A being a signal applied to said first one of said at least two said input terminals, B being a signal applied to said second one of said at least two input terminals and C being a signal applied to said additional input terminal.

* * * * *